US012401377B2

(12) United States Patent
Asadi et al.

(10) Patent No.: US 12,401,377 B2
(45) Date of Patent: Aug. 26, 2025

(54) ERROR CORRECTION BASED ON ASYMMETRIC RATIO

(71) Applicant: SK hynix Inc., Gyeonggi-do (KR)

(72) Inventors: Meysam Asadi, Livermore, CA (US); Fan Zhang, Fremont, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 18/540,595

(22) Filed: Dec. 14, 2023

(65) Prior Publication Data

US 2025/0202502 A1   Jun. 19, 2025

(51) Int. Cl.
    H03M 13/11   (2006.01)
(52) U.S. Cl.
    CPC ............. H03M 13/1108 (2013.01)
(58) Field of Classification Search
    CPC .................................. H03M 13/1108
    See application file for complete search history.

(56) References Cited

U.S. PATENT DOCUMENTS

| | | |
|---|---|---|
| 8,656,257 B1 | 2/2014 | Micheloni et al. |
| 9,385,753 B2 | 7/2016 | Varnica et al. |
| 9,548,764 B1 | 1/2017 | Chilappagari et al. |
| 10,700,706 B2 | 6/2020 | Zhang et al. |
| 10,879,930 B2 | 12/2020 | Ha et al. |
| 11,108,408 B2 | 8/2021 | Kuo |
| 11,189,358 B2 | 11/2021 | Choi et al. |
| 11,381,253 B1 | 7/2022 | Asadi et al. |
| 11,469,775 B2 * | 10/2022 | Savin ............... H03M 13/1108 |
| 2021/0288666 A1 * | 9/2021 | Savin ............... H03M 13/1108 |
| 2023/0162803 A1 | 5/2023 | Zhang et al. |

OTHER PUBLICATIONS

Hareedy, A., et al., "Managing Device Lifecycle: Reconfigurable Constrained Codes for M/T/Q/P-LC Flash Memories," Accepted Manuscript for *IEEE Transactions on Information Theory*, 2020, pp. 1-14, URL: https://doi.org/10.1109/TIT.2020.3032407.

Li, Q., et al., "Exploiting Asymmetric Errors for LDPC Decoding Optimization on 3D NAND Flash Memory," *IEEE Transactions on Computers*, Apr. 2020, vol. 69(4), pp. 475-488, URL: https://doi.org/10.1109/TC.2019.2959318.

* cited by examiner

*Primary Examiner* — Joseph D Torres
(74) *Attorney, Agent, or Firm* — Weaver Austin Villeneuve & Sampson LLP

(57) ABSTRACT

Techniques for decoding a low-density parity check (LDPC) can include determining an asymmetric ratio of bit errors read as logic zero to bit errors read as logic one. The energy of each variable node of the LDPC codeword can be computed. For each variable node having an energy greater than a threshold energy, the variable node can be added to a collection of candidate bits for bit flipping. The asymmetric ratio can then be applied to flip bits in the collection of candidate bits to decode the LDPC codeword.

20 Claims, 8 Drawing Sheets

ERROR CORRECTION BASED ON ASYMMETRIC RATIO

BACKGROUND

Data bits contained in a data stream can get corrupted due to a variety of reasons. For example, some data bits can get corrupted during transmission of the data stream through a transmission channel (such as, for example, a wireless communication link) or when being written into, or read from, a memory device (such as, for example, a hard disk drive or a solid-state drive). Error correcting procedures, which are generally directed at identifying erroneous data bits and correcting the errors, typically involve a trade-off between accuracy, efficiency, and latency. It is desirable to provide solutions that optimize this trade-off.

BRIEF SUMMARY

Techniques for error correction may include decoding a low-density parity check (LDPC) codeword. The LDPC codeword can be decoded by a bit flipping decoder. For example, during an iteration of decoding, an asymmetric ratio of bit errors read as logic zero to bit errors read as logic one can be determined or estimated. An energy of each variable node of the LDPC codeword can be computed. For each variable node having an energy greater than a threshold energy, the variable node can be added to a collection of candidate bits for bit flipping. The asymmetric ratio can then be applied to flip bits in the collection of candidate bits to decode the LDPC codeword. In some implementation, the techniques for error correction can be performed by a device having a memory that stores data using LDPC codewords. The device can be a solid-state storage device, and the memory can be implemented using flash memory. The decoding algorithm can be performed a memory controller. The memory controller may include one or more processors executing software such as firmware implementing the decoding algorithm.

BRIEF DESCRIPTION OF THE DRAWINGS

The detailed description below makes reference to a few example embodiments that are illustrated in the accompanying drawings. However, it should be understood that the description is equally relevant to various other variations of the embodiments described herein. Such embodiments may utilize objects and/or components other than those illustrated in the drawings. It should also be understood that like reference numerals used in the various figures indicate similar or identical objects.

DETAILED DESCRIPTION

Figure 1:
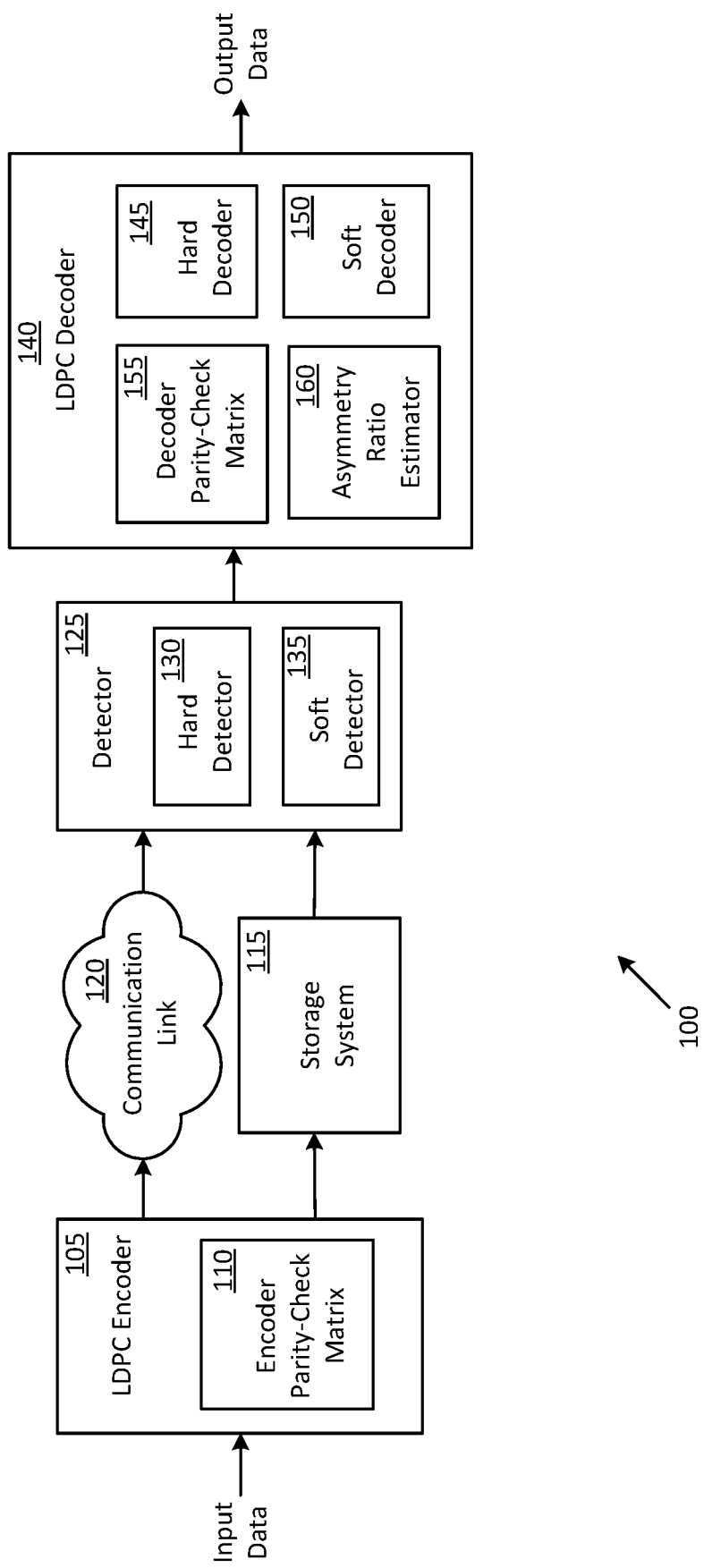
FIG. 1 illustrates a block diagram of an example error correction system that includes an asymmetry ratio estimator, in accordance with an example embodiment of the disclosure.

A data error can be generally characterized as an undesirable change in the logic state of a data bit. In some cases, data errors may be introduced into data after the data has been stored in the memory for a period of time. For example, data that is written at a first voltage level corresponding to a logic state into a memory may be adversely affected by various factors, and may undesirably change to a second voltage level corresponding to a different logic state when being read back from the memory. A write operation can involve storing data in a memory cell by programming the threshold voltage of the memory cell according to ranges of threshold voltages corresponding to different logic states. A subsequent read operation can involve reading the memory cell to determine which of the threshold voltage ranges that the threshold voltage of the cell belongs to, and thus determine the data being stored in the memory cell.

Data errors may also be introduced into data that is being transmitted through a wired or wireless channel. For example, data corresponding to a first logic state at a transmitting end of a communication link may be adversely affected by one or more factors and may be erroneously interpreted as a different logic state at a receiving end. It should be understood that some portions of the description provided below with respect to a memory are equally applicable to a communication channel and should therefore be interpreted and understood in context.

In some cases, data bits stored in a memory or transmitted through a communication channel can be encoded to generate error correction codes (e.g., parity bits) that are added to the original data when being stored or transmitted. In an example implementation, data can be stored with error correction codes in a flash memory (e.g., NAND flash memory) such as, for example, a tri-level coding (TLC) flash memory, a quad-level coding (QLC) memory, a penta-level coding (PLC) memory, or a multi-level coding (MLC) flash memory. The error correction codes along with the data stored in the memory can be provided on to a decoder for purposes of identifying the original data bits that were provided to generate the error correction codes. As a part of this process, the decoder may use one or more error decoding algorithms to detect and correct erroneous data bits.

One example of an error correction code is a low-density parity-check code (LDPC). Different decoding algorithms can be used by a LDPC decoder to perform error correction. For example, in most of solid-state-drive (SSD) products, a bit-flipping (BF) algorithm is used to handle the majority of decoding traffic on read path. The high throughput requirement is usually obtained by using this simple but very fast decoding algorithm. A min-sum hard (MSH) decoding algorithm can also be used, for example, to decode errors that the BF algorithm fail to decode. While the raw bit error rate (RBER) correction of the BF algorithm is approximately half of that of the MSH RBER correction, the BF algorithm latency can be approximately one fifth of the MSH decoding latency. So, in terms of latency, it is more efficient that the read sequence is decoded by a BF decoder.

LDPC decoding in SSD applications typically models the write and read processes as similar to transmitting a message over a binary symmetric channel. In other words, if a page is read at optimal threshold voltages, the number of error bits that changed from a logic 0 to a logic 1 is expected to be similar to the number of error bits that changed from a logic 1 to a logic 0. However, in practice, the reads are usually performed using sub-optimal threshold voltages (e.g., using history read), thereby leading to an asymmetry ratio of $$\alpha_r = \frac{BER_{1 \to 0}}{BER_{0 \to 1}}$$

that is far from 1, where $BER_{0 \to 1}$ indicates a first bit error rate (BER) associated with logic 0 bits that are erroneously read as logic 1 bits, and $BER_{1 \to 0}$ indicates a second BER associated with logic 1 bits that are erroneously read as logic 0 bits. Consequently, if the asymmetric ratio is known, the decoding algorithm can leverage the asymmetric ratio to make better decisions when performing error correction.

In the description provided herein, some specific details are set forth for the purposes of explanation and to provide a thorough understanding of certain embodiments. However, it will be apparent that various embodiments may be practiced without these specific details. Hence, the figures and description are not intended to be restrictive. Certain words and phrases are used herein based on convenience and such words and phrases should be interpreted in various forms and equivalencies by persons of ordinary skill in the art. For example, the word "bit" as used herein represents a binary value (either a "1" or a "0") that can be stored in a memory.

FIG. 1 illustrates a block diagram of an example error correction system 100 that includes an asymmetry ratio estimator 160 in accordance with an embodiment of the disclosure. In various embodiments, certain components of the error correction system 100 may be implemented using a variety of techniques including an application-specific integrated circuit (ASIC), a field-programmable gate array (FPGA), and/or a general-purpose processor (e.g., an Advanced RISC Machine (ARM) core).

The example error correction system 100 includes an LDPC encoder 105 that encodes input data (e.g., by adding parity bits) suitable for storing in a storage system 115 or for transmission through a communication link 120. Encoding the input data enables the use of error correction procedures for correcting bit errors that may occur during operations such as, for example, writing the data into the storage system 115, reading the stored data from the storage system 115, or propagation via the communication link 120. In an example scenario, the communication link 120 can be a wired or wireless communication channel. Storage system 115 can be, or can include, for example, a solid-state drive (SSD), a storage card, a Universal Standard Bus (USB) drive, and/or other storage components that are implemented using flash memories (e.g., NAND flash memories). It should be understood that various aspects of the disclosure that are described herein with respect to NAND flash memories are equally applicable to various other types of memories and to various types of communication links as well.

In an example implementation, the data and parity bits produced by the LDPC encoder 105 can be stored in memory cells in a multi-level flash memory of the storage system 115. An array of multi-level flash memories can be configured to include multiple memory blocks. Each memory block may include multiple pages. For example, a set of memory cells having a word line that is coupled in common to each of the memory cells can be configured as a page that can be read and written (or programmed) concurrently.

More specifically, a multi-level flash memory can be a type of NAND flash memory containing an array of cells each of which can be used to store multiple bits of data. For example, a tri-level cell (TLC) flash memory can store three bits of data per cell. Each of the three bits of data can be either in a programmed state (logic 0) or in an erased stated (logic 1), thereby allowing for storage of any of eight possible logic bit combinations in each cell. Each cell can be configured to store three bits of data by placing one of eight charge levels in a charge trap layer of a cell. Thus, for example, a cell may be configured to store a 000 logic bit combination by placing a first amount of charge in the cell, a cell may be configured to store a 110 logic bit combination by placing a second amount of charge in the cell, and so on. More generally, a N-bit multi-level cell can have $2^N$ logic states or charge levels representing the different possible combinations of N bits.

Data bit errors may be introduced during storage of the data bits in the multi-level flash memory and/or when writing/reading the data bits in/out of the multi-level flash memory. The data bit errors may be introduced because of various factors such as, for example, hardware defects in the flash memory, aging of the flash memory, interference by adjacent pages, software bugs, and/or read/write timing issues, read/write thresholds, etc.

In some applications, the data bits encoded by the LDPC encoder 105 may be communicated on a communication link 120. Data bit errors may be introduced during propagation of the data bits through the communication link 120. The errors may be introduced because of various factors such as, for example, a transmission line having a sub-optimal characteristic impedance or a noisy wireless communication link (atmospheric disturbances, signal propagation delays, signal fading issues, multi-path issues, inter-symbol interference, etc.).

The detector 125 is configured to read the data bits stored in the storage system 115 and/or to detect the data bits received via the communication link 120. In an example implementation, the detector 125 includes a hard detector 130 and a soft detector 135. The hard detector 130 carries out detection based on voltage thresholds that provide an indication whether a detected bit is either a one or a zero. The input data bits provided to the detector 125 from the storage system 115 and/or the communication link 120 can have deficiencies such as, for example, bit errors and/or signals that vary in amplitude over time (jitter, fading, reflections, etc.). Consequently, the output produced by the hard detector 130 can contain hard errors where one or more bits have been detected inaccurately (a logic 1 read as a logic 0, or vice-versa). The soft detector 135 operates upon the input data and produces an output that is based on statistical probabilities and provides a quantitative indication of a likelihood that a detected bit is either a logic 1 or a logic 0. The statistical probabilities can be characterized by log likelihood ratio (LLR) values. A LLR that is less than 0 indicates that the bit is likely a "1"; and a LLR that is grater than 0 indicates the bit is likely a "0." The larger the magnitude of the LLR, the more likely that the bit is the designated bit value.

The output of the detector 125 is coupled into the LDPC decoder 140. In an example implementation, the LDPC decoder 140 uses a decoder parity-check matrix 155 during decoding of the data bits. The decoder parity-check matrix 155 corresponds to the encoder parity-check matrix 110, and vice-versa. In the illustrated example, the hard detector bits provided by the detector 125 may be decoded by a hard decoder 145. The soft detector bits and the statistical probability information provided by the detector 125 may be decoded by the soft decoder 150 by use of LLR values.

As indicated above, an LDPC decoder typically assumes ideal behavior with symmetric errors (e.g., $BER_{0 \to 1}$ and $BER_{1 \to 0}$ being equal or about the same). However, actual flash operations (e.g., using imperfect read thresholds) can result in asymmetric errors. Consequently, in accordance with the disclosure, an asymmetry ratio estimator 160 is used to determine an asymmetric ratio ar. The asymmetric ratio $\alpha_r$ can then be used by the LDPC decoder 140 to tailor the decoding decisions to more effectively correct erroneous data bits. Details pertaining to this topic are described below.

Figure 2:
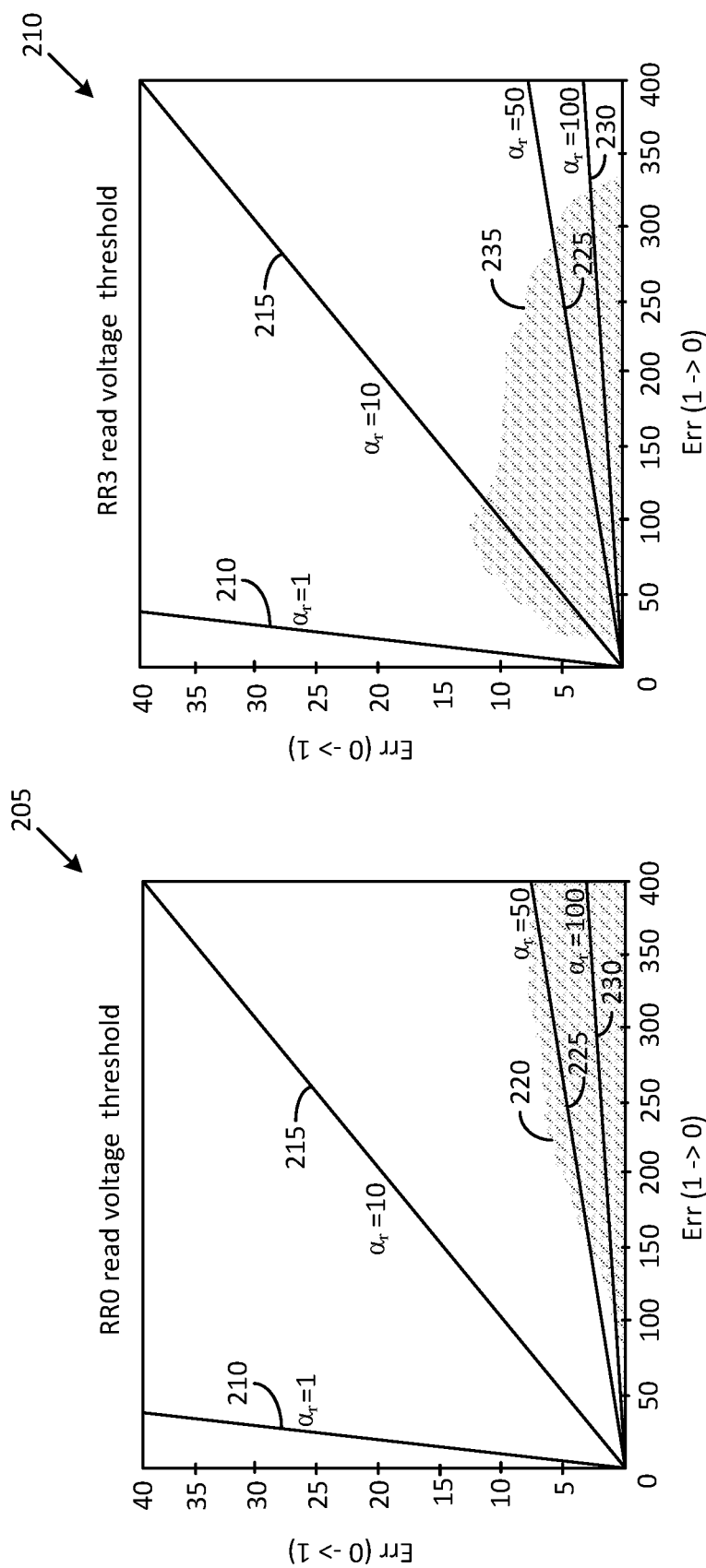
FIG. 2 illustrates two example distribution characteristics associated with two example read thresholds used upon a NAND flash memory.

FIG. 2 shows two example graphs that illustrate the distributions of errors associated with two respective example sets of read thresholds applied to a NAND flash memory. Graph 205 shows a relationship between $BER_{0 \to 1}$ on the y-axis and $BER_{1 \to 0}$ on the x-axis for pages of a NAND flash memory at an end-of-life condition when the NAND flash memory is read using a first set of read retry voltage thresholds (RR0). Demarcation line 210 indicates an ideal asymmetric ratio ($\alpha_r=1$) that corresponds to a symmetric random distribution of logic 1 error bits and logic 0 error bits in which the $BER_{0 \to 1}$ is equal to $BER_{1 \to 0}$. It should be noted that the y-axis markings in the example graph 205 range from 0 to 40, and the x-axis markings range from 0 to 400. Hence, the scale on the x-axis is 10× of the scale on the y-axis. Line 210 indicates the ideal case, in which the likelihood of a logic 0 being read as a logic 1 is the same as the likelihood of a logic 1 being read as a logic 0.

Demarcation line 215 indicates an asymmetry ratio ($\alpha_r=10$) where the $BER_{1 \to 0}$ is 10 times that of $BER_{0 \to 1}$, which corresponds to a likelihood of a logic 1 bit being read as a logic 0 bit being 10 times as likely as a logic 0 bit being read as a logic 1 bit. Demarcation line 225 indicates an asymmetry ratio ($\alpha_r=50$) where the $BER_{1 \to 0}$ is 50 times that of $BER_{0 \to 1}$, which corresponds to a likelihood of a logic 1 bit being read as a logic 0 bit being 50 times as likely as a logic 0 bit being read as a logic 1 bit. Demarcation line 230 indicates an asymmetry ratio ($\alpha_r=100$) where the $BER_{1 \to 0}$ is 100 times that of $BER_{0 \to 1}$, which corresponds to a likelihood of a logic 1 bit being read as a logic 0 bit being 100 times as likely as a logic 0 bit being read as a logic 1 bit.

The error distribution 220 (shown with crosshatched fille pattern) illustrates the bit error ratios from multiple reads of multiple pages, where each read was carried out upon a page in the NAND flash memory at an end-of-life condition having undergone 11K read/write cycles. Each read was carried out by using by using read voltages from a read retry entry RR0, and after a 30-day storage period for each page. As FIG. 2 illustrates, reading the NAND flash memory under such conditions with RR0 read thresholds exhibits a distribution that is denser at $\alpha_r$ values at about 50 and higher.

Graph 210 shows a relationship between $BER_{0 \to 1}$ and $BER_{1 \to 0}$ for pages of the NAND flash memory at an end-of-life condition when the NAND flash memory is read using read voltages from a different read retry entry RR3. Demarcation lines 210, line 215, line 225, and line 230 are identical to those shown in graph 205. The error distribution 235 (shown with crosshatched fille pattern) illustrating the bit error ratios for RR3 is different than the distribution for RR0 shown in graph 205. In this case, the distribution is spread out over a region that encompasses $\alpha_r$ values near 10 and ranging to 100 and greater. The asymmetric ratio $\alpha_r$ can be used by the LDPC decoder 140 to perform bit flipping error correction operations more efficiently. The asymmetry ratio estimator 160 can be used in accordance with the disclosure to determine an estimation of the $\alpha_r$ value.

LDPC codes are usually represented by bipartite graphs. One set of nodes, the variable nodes (VNs, also referred to as bit nodes) correspond to elements of the codeword and the other set of nodes, e.g., check nodes (CNs), correspond to the set of parity-check constraints satisfied by the codeword. Typically, the edge connections are chosen at random. The error correction capability of an LDPC code is improved if cycles of short length are avoided in the graph. In an (r,c) regular code, each of the n variable nodes (e.g., V0, V1, V2 . . . Vn−1) has connections to r check nodes, and each of the m check nodes (e.g., C0, C1, C2 . . . Cm−1) has connections to c variable nodes. Each check node represents a separate parity-check equation. Thus, r corresponds to the number of parity-check equations involving each code bit and also the degree of each variable node. Similarly, c corresponds to the number of code bits involved in each parity-check equation and also the degree of each check node. The number of variable nodes (n) corresponds to the total number of bits (data and parity) in the code, i.e., the codeword length.

In an irregular LDPC code, the check node degree is not uniform. Similarly, the variable node degree is not uniform. In quasi-cyclic LDPC (QC-LDPC) codes, the parity-check matrix H can be structured into blocks of p×p matrices such that a bit in a block participates in only one parity-check equation in the block, and each parity-check equation in the block involves only one bit from the block. In QC-LDPC codes, a cyclic shift of a codeword by p results in another codeword. Here p is the size of a square matrix which is either a zero matrix or a circulant matrix. This is a generalization of a cyclic code in which a cyclic shift of a codeword by 1 results in another codeword. The block of p×p matrix can be a zero matrix or cyclically shifted identity matrix of size p×p.

Figures 3A, 3B:
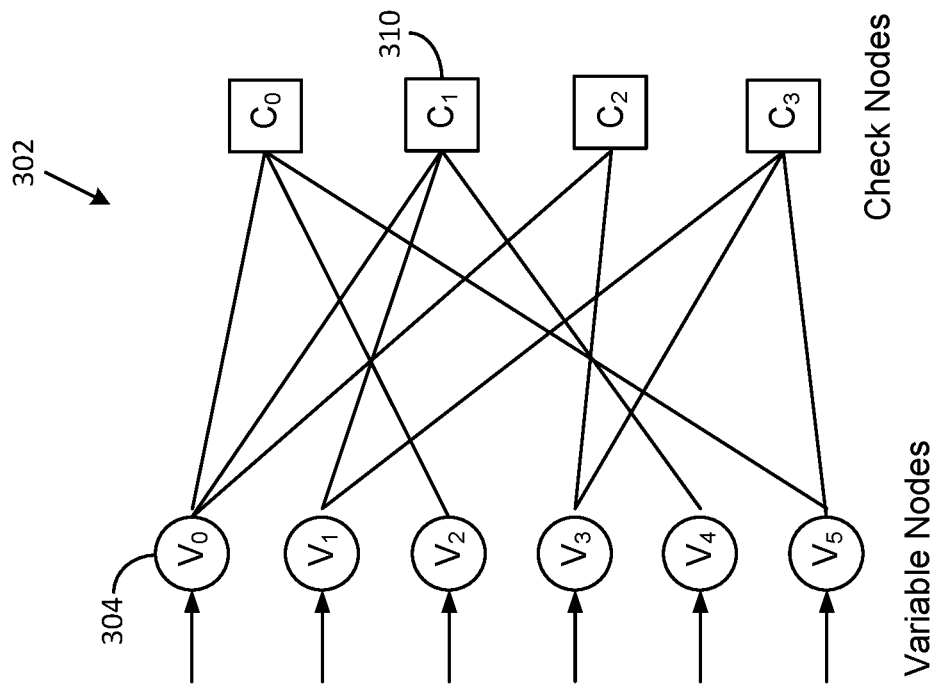
FIGS. 3A and 3B illustrate an example parity-check matrix and an example graph representing the parity-check matrix.

FIG. 3A illustrates an example parity-check matrix H 300 and FIG. 3B illustrates an example bipartite graph corresponding to the parity-check matrix 300, in accordance with certain embodiments of the present disclosure. In this example, the parity-check matrix 300 has six column vectors and four row vectors. In practice, parity-check matrices tend to be much larger. Network 302 forms a bipartite graph representing the parity-check matrix 300. Various type of bipartite graphs are possible, including, for example, a Tanner graph.

Generally, the variable nodes in the network 302 correspond to the column vectors in the parity-check matrix 300. The check nodes in the network 302 correspond to the row vectors of the parity-check matrix 300. The interconnections between the nodes are determined by the values of the parity-check matrix 300. Specifically, a "1" indicates that the CN and VN at the corresponding row and column position have a connection. A "0" indicates there is no connection. For example, the "1" in the leftmost column vector and the second row vector from the top in the parity-check matrix 300 corresponds to the connection between a VN 304 and a CN 310 in FIG. 3B. Collectively, the check nodes represent a syndrome computed through applying the parity-check equations represented by the parity-check matrix 300 to the received codeword. A syndrome weight (also known as a checksum) can be computed by summing together the bit-values of all the check nodes.

A bit flipping algorithm can generally be used to decode LDPC codes. Bit flipping uses a network of variable nodes and check nodes, as shown in FIG. 3B. The connections between variable nodes and check nodes are described by and correspond to the values of the parity-check matrix 300, as shown in FIG. 3A. Bit flipping utilizes a majority vote mechanism. A parity value computed over all variable nodes connected to a check node is compared with the value of the check node to determine if the check node is satisfied. The bit flipping energy of each variable node is determined, for example, as the number of unsatisfied check nodes that are connected to the variable node. If the bit flipping energy is above a threshold T (e.g., T can be set to half the degree of the variable node, or half of the number of check nodes that the variable node is connected to), the variable node is flipped to determine if flipping the variable node yields all satisfactory check nodes. The process can continue until all check nodes are satisfied, at which point the decoder has successfully decoded the data, or when a maximum number of iterations have been reached. For the latter case, a more aggressive decoding algorithm (e.g., MSH) can be used to attempt to recover the data.

The example error correcting procedure described above with reference to the parity-check matrix 300 and the network 302 can be adapted to perform an error correction operation based on using an estimated asymmetry ratio ($\alpha_r$). More particularly, a bit-flipping operation performed as a part of the variable node processing operations described above can incorporate an asymmetry ratio ($\alpha_r$), which can be estimated by use of a deterministic function in accordance with a first example embodiment that is described below.

In this first example embodiment, a set of observables obtained from the LDPC decoder 140 can be used for determining an asymmetry ratio ($\alpha_r$). An example set of observables can include the following:

$CS_i$: Checksum at end of i-th iteration
$n_1$: Total number of bits with Lch[j]<0
$C_i^{0 \to 1}$: Number of VNs with Channel mismatch (#j: Lch[j]>0, $HD_i$[j]=1)
$C_i^{1 \to 0}$: Number of VNs with Channel mismatch (#j: Lch[j]<0, $HD_i$[j]=0)

In the above notation, Lch[j] denotes the log likelihood ratio of the j-th VN, and $HD_i$(j) denotes the estimate bit hard decision of j-th VN at i-th iteration. Hence, $n_1$ represents the total number of bits that are read as "1" (e.g., LLR less than 0); $C_i^{0 \to 1}$ represents the number of bits that is read as a "0" (e.g., LLR greater than 0) but the decoder hard decision at the i-th decoding iteration determined the bit is a "1"; and $C_i^{1 \to 0}$ represents the number of bits that is read as a "1" (e.g., LLR less than 0) but the decoder hard decision at the i-th decoding iteration determined the bit is a "0."

The asymmetry ratio ($\alpha_r$) can be estimated based on the following relationship:

$$\hat{\alpha}_r = g(CS_i, C_i^{0 \to 1}, C_i^{1 \to 0}, n_1),$$

where g(.) is a deterministic function of the decoder observables.

One example of such deterministic function is $$\hat{\alpha}_r = \frac{c_i^{1 \to 0} * (n - n_1)}{c_i^{0 \to 1} * n_1},$$

if $CS_i$<T, where n is the total number of bits, and T is an acceptable threshold for estimating the asymmetric ratio in the decoding algorithm. In an example implementation, $$T = \frac{CS_0}{2}.$$

In other words, if the number of 1's in the checksum of the iteration $CS_i$ is less than half the number of 1's in the initial checksum $CS_0$, then the estimated asymmetric ratio can be computed. It should be noted that other thresholds can be used for T.

Figure 4:
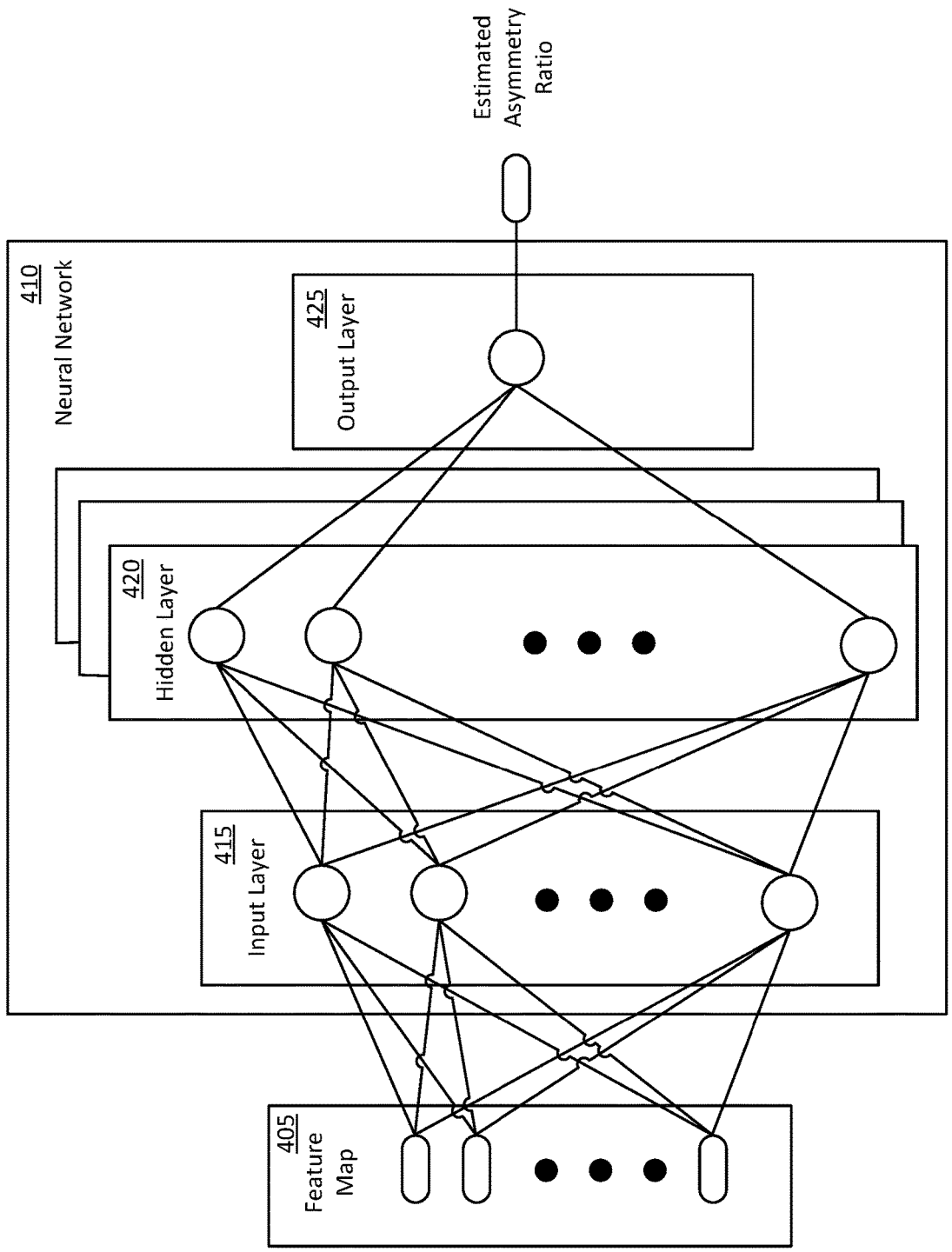
FIG. 4 illustrates an example neural network configured as an asymmetry ratio estimator, in accordance with an embodiment the disclosure.

In accordance with a second example embodiment, the asymmetry ratio ($\alpha_r$) can be estimated by a neural network model. FIG. 4 illustrates an example neural network 410 configured as an asymmetry ratio estimator in accordance with an embodiment of the disclosure. The example neural network 410 can be any of various types of deep neural networks that include one or more hidden layers. The activation function for each layer can be a rectified linear unit (ReLU) function.

By way of example, feature maps 405 each associated with one or more observables can be used as inputs to neural network 410 (such as, for example, ($C_{si}$, $n_1$, $C_i^{0 \to 1}$, $C_i^{1 \to 0}$, etc.). In turn, the neural network 410 outputs an estimated asymmetry ratio ($\alpha_r$). As illustrated, the neural network 410 includes multiple layers. Feature maps 405 are connected to input nodes in an input layer 415 of the neural network. The estimated asymmetry ratio ($\alpha_r$) is generated from an output node of an output layer 425. One or more hidden layers 420 of the neural network 410 exist between the input layer 415 and the output layer 425. The neural network 410 is pre-trained to process the feature maps 405 through the different layers 415, 420, and 425 in order to output the optimal asymmetry ratio ($\alpha_r$).

In some embodiments, the neural network 410 is a multi-layer neural network that represents a network of interconnected nodes, such as an artificial deep neural network, where knowledge about the nodes (e.g., information about specific features represented by the nodes) is shared across layers and knowledge specific to each layer is also retained. Each node represents a piece of information. Knowledge can be exchanged between nodes through node-to-node interconnections. Input to the neural network 410 activates a set of nodes. In turn, this set of nodes activates other nodes, thereby propagating knowledge about the input. This activation process is repeated across other nodes until nodes in an output layer are selected and activated.

As illustrated, the neural network 410 includes a hierarchy of layers representing a hierarchy of nodes interconnected in a feed-forward way. The input layer 415, which exists at the lowest hierarchy level, includes a set of nodes that are referred to herein as input nodes. When the inputs are provided to the neural network 410, each of the input nodes of the input layer 415 is connected to each feature of the feature maps. Each of the connections has a weight. These weights are one set of parameters that are derived from the training of the neural network 410. The input nodes transform the features by applying an activation function to the weighted features. The information derived from the transformation are passed to the nodes at a higher level of the hierarchy.

The output layer 425, which exists at the highest hierarchy level, includes an output node that outputs the estimated asymmetry ratio ($\alpha_r$). The hidden layer(s) 420 exists between the input layer 415 and the output layer 425. The hidden layer(s) 420 includes "M" number of hidden layers, where "M" is an integer greater than or equal to one. In turn, each of the hidden layers also includes a set of nodes that are referred to herein as hidden nodes. In an example implementation, neural network model 410 may include two hidden layers, and each layer can be a fully connected layer.

At the lowest level of the hidden layer(s) 420, hidden nodes of that layer are interconnected to the input nodes. At the highest level of the hidden layer(s) 420, hidden nodes of that level are interconnected to the output node. The input nodes are not directly interconnected to the output node(s). If multiple hidden layers exist, the input nodes are interconnected to hidden nodes of the lowest hidden layer. In turn, these hidden nodes are interconnected to the hidden nodes of the next hidden layer and so on and so forth. An interconnection represents a piece of information learned about the two interconnected nodes. The interconnection has a numeric weight that can be tuned (e.g., based on a training dataset), rendering the neural network 410 adaptive to inputs and capable of learning.

Generally, the hidden layer(s) 420 allows knowledge about the input nodes of the input layer 415 to be shared among the output nodes of the output layer 425. To do so, a transformation $f$ is applied to the input nodes through the hidden layer 420. In an example, the transformation $f$ is non-linear. Different non-linear transformations $f$ are available including, for instance, a rectifier function $f(x)=\max(0, x)$. In an example, a particular non-linear transformation $f$ is selected based on cross-validation. For example, given known example pairs $(x, y)$, where $x \in X$ and $y \in Y$, a function $f: X \rightarrow Y$ is selected when such a function results in the best matches.

The neural network 410 also uses a loss function l (or, referred to also as a cost function c) to find an optimal solution. The optimal solution represents the situation where no solution has a loss less than the loss of the optimal solution. In an example, the loss function l includes a mean-squared error function that minimizes the average squared error between an output $f(x)$ and a target value y over all the example pairs $(x, y)$. A backpropagation algorithm that uses gradient descent to minimize the loss function is used to train the neural network 410. In an example, the training is a supervised training. During the supervised training, the target value y can be set as the actual observed asymmetric ratio for the training dataset. The output $f(x)$ can be the learned estimated asymmetric ratio based on the particular combination of input feature maps. As such, the hidden layer(s) 420 retains knowledge about the input nodes. A set of knowledge is shared across the output node(s) based on the interconnections of the hidden nodes and the input nodes.

The goal of the training is to refine the parameters of the neural network to minimize the difference between the target value y and the output $f(x)$. In an example embodiment, trained parameters ($w_{trained}$, $B_{trained}$) generated by the neural network 410 are used to estimate the asymmetry ratio ($\alpha_r$). "W" represents weight and "B" represents bias. In this case, $f(w_{trained}, B_{trained})$ represents the overall inference model for producing the estimated asymmetry ratio $\hat{\alpha}_r = f(w_{trained}, B_{trained})$.

Figure 5:
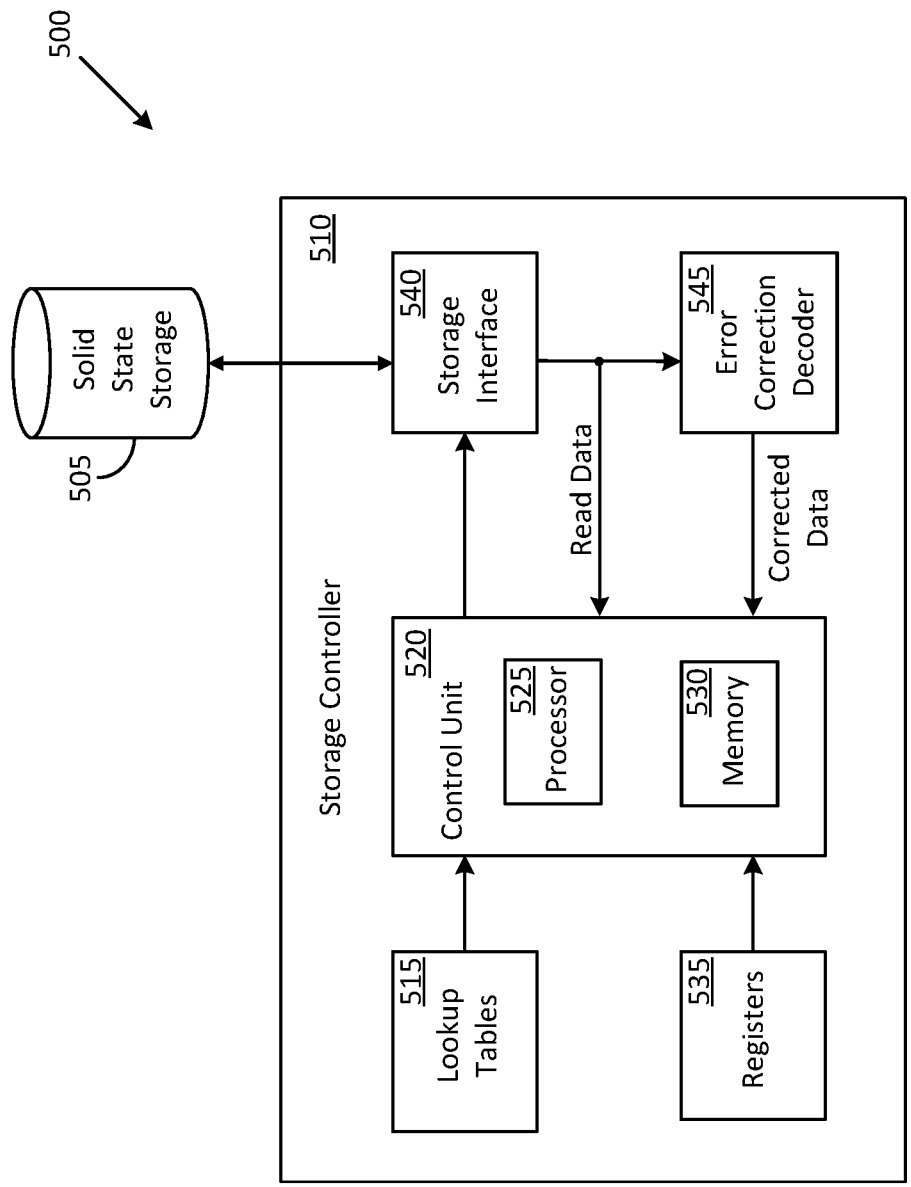
FIG. 5 illustrates a block diagram of an example storage device configured to determine an optimal asymmetry ratio, in accordance with the disclosure.

FIG. 5 shows a simplified block diagram illustrating a solid-state storage device 500, which can be an example of an electronic device utilizing the asymmetric ratio estimating techniques described herein. As shown, solid-state storage device 500 can include a solid-state storage 505 (e.g., implemented using NAND flash memory) and a storage controller 510. Storage controller 510, also referred to as a memory controller, is one example of a device that can perform the processes and techniques described herein. In some embodiments, storage controller 510 can be implemented using integrated circuit components such as an application-specific integrated circuit (ASIC), field programmable gate array (FPGA), etc. Some of the functions can also be implemented in firmware or software. Solid-state storage device 500 can be an example of a solid-state drive (SSD).

Control unit 520 can include one or more processors 525 and a memory 530 (non-transitory computer readable medium) for performing various control functions described herein. Memory 530 can store, for example, firmware and/or software code that are executable by storage controller 510. Storage controller 510 can also include lookup tables 515, which can include, for example, various asymmetric values, read retry entries of read voltages, and/or other parameters/functions associated with operating solid-state storage 505. Registers 535 can be used to store data for control functions and configurations for storage controller 510.

Control unit 520 can be coupled to solid-state storage 505 through a storage interface 540 (may also be referred to as a memory interface). Error-correction decoder 545 (e.g., LDPC decoder) can perform error-correction decoding on the read data and send the corrected data to controller 520. In some implementations, error correction decoder 545 can be implemented as part of control unit 520. Control unit 520 may also communicate with a host device (e.g., host computer) via a host interface (not shown).

An example decoding operation that involves a bit-flipping error correcting procedure executed by the storage controller 510 in accordance with the disclosure can be described by the following pseudocode:

Suppose $d^{(-1)} = [d_0^{(-1)}, d_1^{(-1)}, \ldots, d_{n-1}^{(-1)}] = y$ be the initial hard decision obtained from a received data sequence y.

Let $syn^{(i)} = [d_0^{(i)}, d_1^{(i)}, \ldots, d_{n-1}^{(i)}] \times H^T$ represents syndrome at each iteration i, and checksum $cs_i = \|syn^{(i)}\|$, where $H^T$ is the transposed parity-check matrix.

Let L be the number of allowed decoding attempts; l be the current decoding attempt; iter be the iteration within the current decoding attempt; $S_0$ be the set of candidate variable nodes for bit flipping that are estimated to be a "0"; $S_1$ be the set of candidate variable nodes for bit flipping that are estimated to be "1"; $b_0$ be the size of $S_0$; $b_1$ be the size of $S_1$; m be the iteration threshold starting at which the estimated asymmetric ratio α is considered in the bit flipping algorithm; $E_{vn}$ be the energy of the variable node vn; T be the threshold energy for a variable node to be considered a candidate for bit flipping; $cs_{min}$ be the minimum checksum over which the estimated asymmetric ratio α is applied to the bit flipping decision; and θ be the threshold of the estimated asymmetric ratio to continue with the next decoding attempt.

Initial Step: set l=0, L=1;
While l<L:
    Step 0: Set iter=0, calculate $syn^{(-1)}$, and go to step 1;
    Step 1: if l=0, set α=1.
    Step 2: iter=iter+1, if reach max iteration, stop decoding. Otherwise, set $S_0$, $S_1$=$b_0$, $b_1$=0, 0 and go to step 3;
    Step 3: if $cs_i$=0, stop decoding. Otherwise, go to step 4.
    Step 4: For all vn:
        If iter<m:
            Store ($cs_i$, $C_i^{0 \rightarrow 1}$, $C_i^{1 \rightarrow 0}$).
        If iter==m and l==0:
            Run $\hat{\alpha}_r$ estimators to compute $\alpha = \hat{\alpha}_r$.
            Compute energy function $E_{vn}$.

If $E_{vn}>T$ and LLR(vn)<0,
  add vn into set $S_1$, increment $b_1$
else if $E_{vn}>T$ and LLR(vn)>=0
  add vn into set $S_0$, increment $b_0$
Step 5: If $b_0<\alpha \cdot b_1$ and $cs_{iter}>cs_{min}$:
  Flip all the bits in $S_0$ and flip ($b_0/\alpha$) bits randomly from set $S_1$
Else if $b_0 \geq \alpha \cdot b_1$ and $cs_{iter}>cs_{min}$:
  Flip all the bits in $S_1$ and flip ($\alpha \cdot b_1$) bits randomly from set $S_0$
Else:
  Flip all the bits in candidate set $S_0$, $S_1$.
Step 6: Go to step 2.
l=l+1
Step 7:
  if $\hat{\alpha}>\theta$ or, $$\hat{\alpha} < \frac{1}{\theta}$$

L=L+1

Optimized parameters such as m, θ, $cs_{min}$ can be obtained from simulation. In an example implementation, the following values may be used for the parameters m, θ, $cs_{min}$:

$$m = \frac{iter_{max}}{2},$$

θ=5, $$cs_{min} = \frac{cs_{max}}{10}.$$

Initially, the decoding attempt number l is set to 0, and the allowable number of decoding attempts L is set to 1. At step 0, the iteration number for the current decoding attempt is initially set to 0, and the initial syndrome is computed. At step 1, if this is the first decoding attempt, the asymmetric ratio is assumed to be 1. At step 2, the iteration count is incremented. If this is the first iteration, the iteration count will be 1. If the iteration count has reached the maximum number of allowable iterations $iter_{max}$ (e.g., determined based on a latency or quality-of-service (QOS) specification), the decoding is terminated. Otherwise, the two sets of candidate variable nodes for bit flipping $S_0$ and $S_1$ are initialized as empty sets. At step 3, if the checksum is zero, the decoding can be terminated because there are no errors in the data, or the data has been correctly decoded. If the checksum is not zero, then the operations are performed for each variable node.

At step 4, if the iteration count is less the threshold iteration m, the current iteration's checksum and variable node mismatch information are stored, for example, in an array. This information can be used to estimate the asymmetric ratio at a later iteration. If the iteration count has reached the threshold iteration m, the asymmetric ratio is estimated based on the previously stored data. The bit flipping energy $E_{vn}$ of each variable node is determined. For example, the bit flipping energy of a variable node can be determined as the number of unsatisfied check nodes that are connected to the variable node. If the bit flipping energy is above a threshold T (e.g., T can be set to half the degree of the variable node, or half of the number of check nodes that the variable node is connected to), the variable node is added to the appropriate candidate set. For example, a variable node estimated to be a "1" is added to $S_1$; a variable node estimated to be a "0" is added to $S_0$. The sizes of the two sets $b_0$ and $b_1$ are incremented accordingly.

At step 5, after all the variable nodes have been processed, the estimated asymmetric ratio can be applied to the bit flipping decision. If $b_0$ (the size of $S_0$) is less than the estimated asymmetric ratio α times $b_1$ (the size of $S_1$), and the checksum for this iteration is greater than a checksum threshold, all the variable nodes in $S_0$ are flipped, and $b_0/\alpha$ number of variable nodes in $S_1$ are randomly flipped. If $b_0$ (the size of $S_0$) is greater than or equal to the estimated asymmetric ratio α times $b_1$ (the size of $S_1$), and the checksum for this iteration is greater than a checksum threshold, all the variable nodes in $S_1$ are flipped, and $\alpha \cdot b_1$ number of variable nodes in $S_0$ are randomly flipped. Otherwise, all variable nodes in $S_0$ and $S_1$ are flipped.

At step 6, the process returns to step 2 for the next iteration to check the recomputed checksum based on the flipped bits. The process repeats until the checksum converges to 0, or until the maximum number of iterations has been reached. The current decoding attempt is then complete, and the decoding attempt number is incremented. At step 7, the estimated asymmetric ratio is compared with a threshold θ. If the estimated asymmetric ratio is greater than the threshold, or is less than the reciprocal of the threshold, the estimated asymmetric ratio is away from ideal, and a further decoding attempt can be performed by incrementing the maximum allowable decoding attempts L. If the estimated asymmetric ratio is near the threshold, further decoding attempts applying the estimated asymmetric ratio may yield similar results because the asymmetric ratio is close to ideal. As such, it is not necessary to perform further decoding attempts applying the asymmetric ratio, and the decoder can revert to normal processing.

Figure 6:
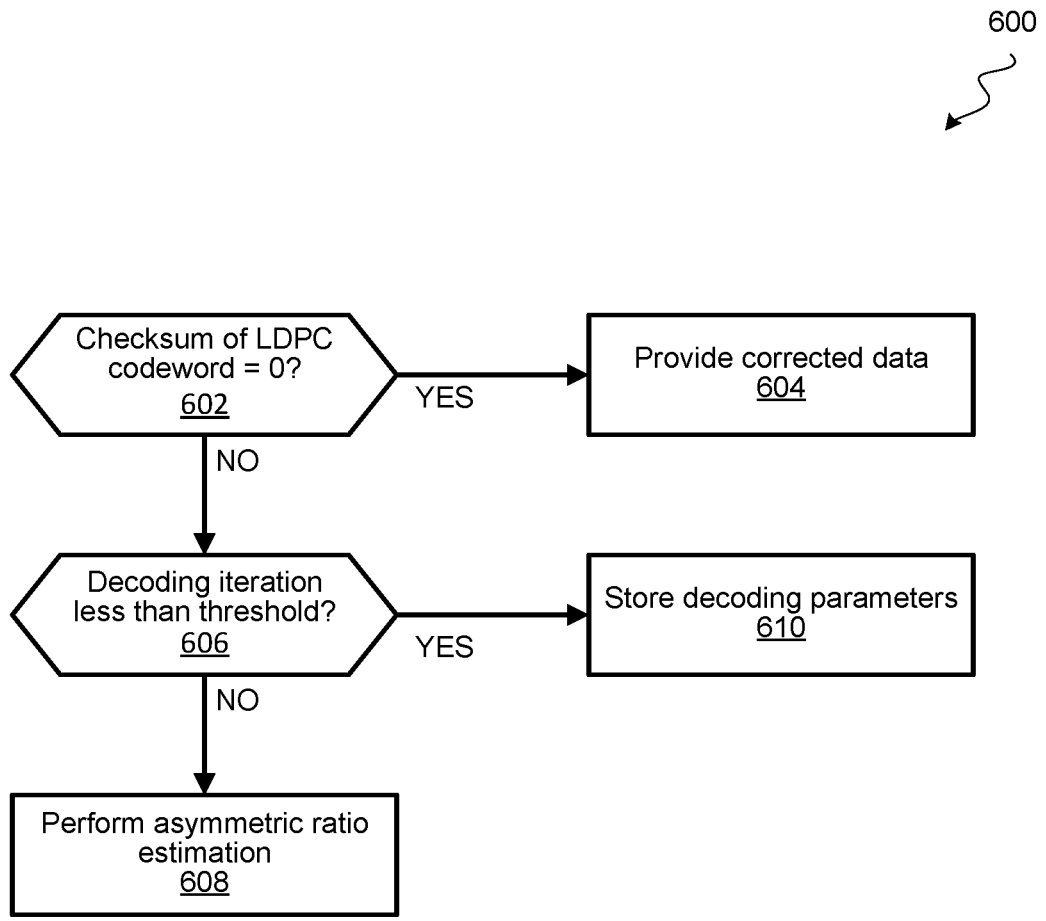
FIG. 6 illustrates a flow diagram of an example process of error correction, in accordance with the disclosure.

FIG. 6 illustrates a flow diagram of an example of a process 600 for decoding a LDPC codeword. In some implementations, process 600 can be executed by a memory controller, and the LDPC codeword can be, for example, data read from a memory such as a flash memory of a solid-state storage device. Process 600 can be implemented as software (e.g., firmware) executed by one or more processors, or a combination of software and hardware circuitry to perform error correction for the solid-state storage device. In some implementations, process 600 can be implemented in a bit flipping (BF) decoder.

Process 600 may begin at block 602 by determining a checksum of the data (e.g., the LDPC codeword) for the current iteration of decoding in a decoding attempt. If the checksum is zero, the data does not contain any errors, or the data has been successfully decoded and corrected. As such, at block 604, the data can be provided, for example, to a host device that is performing a read of the solid-state storage device. At block 606, if the checksum is not zero, a determination is made if the current iteration of decoding is below a threshold number of decoding iterations. If the number of decoding iterations for the current decoding attempt has reached the threshold, the asymmetric ratio can be estimated at block 608 and be used to increase the likelihood of successfully decoding the codeword. If the number of decoding iterations for the current decoding attempt has not reached the threshold, various parameters are stored at block 610. These parameters may include the checksum, the number of variable nodes read as logic zero and having a hard decision of being a logic one, and the number of variable nodes read as a logic one and having a hard decision of being a logic one. Process 600 can then be performed again for the next iteration of decoding.

Figure 7:
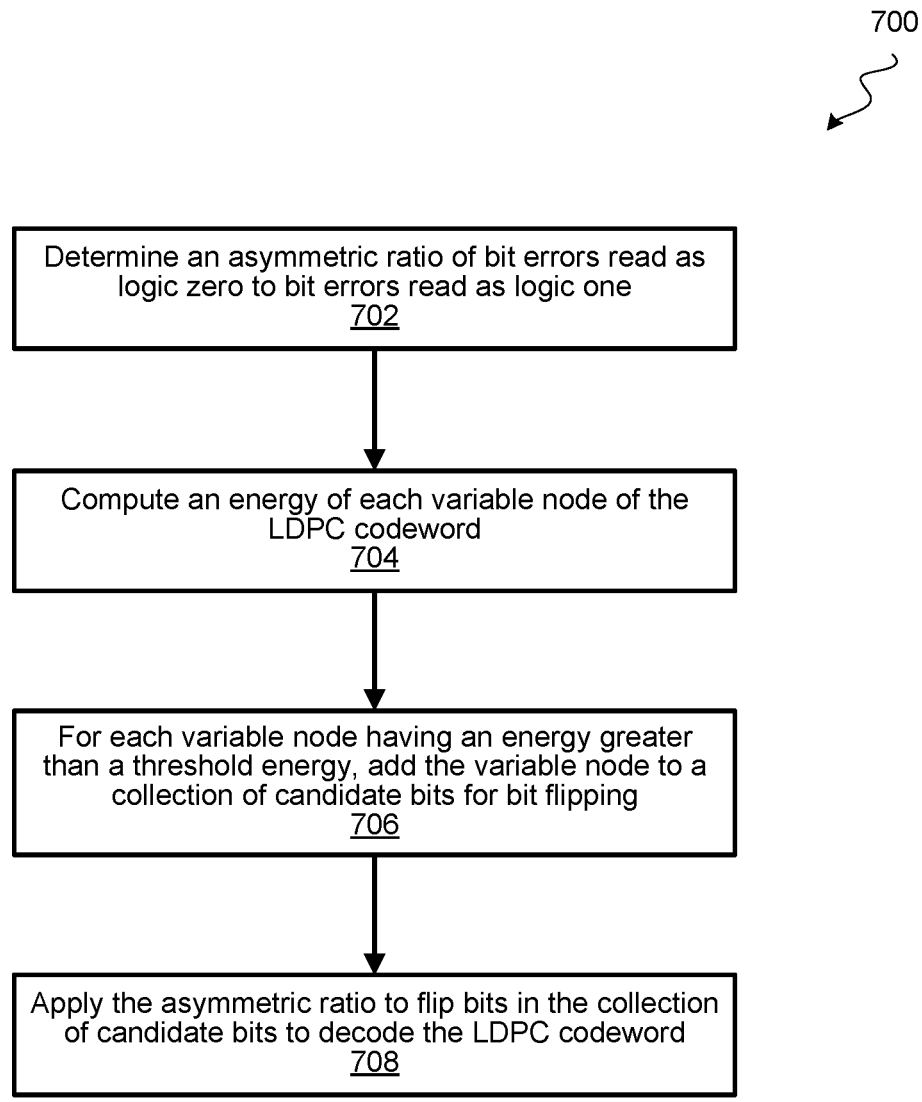
FIG. 7 illustrates a flow diagram of an example process of applying an asymmetry ratio, in accordance with the disclosure.

FIG. 7 illustrates a flow diagram of an example of a process 700 for utilizing the asymmetric ratio for decoding a LDPC codeword. In some implementations, process 700 can be executed as part of block 608 in process 600 during an iteration of decoding in a decoding attempt. Process 600 can be performed after a threshold number of previous decoding iterations have been performed without applying the asymmetric ratio. Process 700 can be implemented as software (e.g., firmware) executed by one or more processors, or a combination of software and hardware circuitry to perform error correction. In some implementations, process 700 can be implemented in a bit flipping (BF) decoder as part of the decoding algorithm.

Process 700 may begin at block 702 by determining an asymmetric ratio of bit errors read as logic zero to bit errors read as logic one during an iteration of decoding in a decoding attempt. In some implementations, the asymmetric ratio can be determined when the number of 1's in the checksum of an iteration is less than half the number of 1's in an initial checksum. The asymmetric ratio can be determined based on the decoding parameters stored in the prior iterations at block 610 of process 600. For example, the asymmetric ratio can be determined as a function of the checksum, the number of variable nodes read as a logic zero and having a hard decision of being a logic one, and the number of variable nodes read as a logic one and having a hard decision of being a logic zero. In some implementations, a machine learning model can be trained on the decoding parameters, and the machine learning model can used to determine the asymmetric ratio.

At block 704, an energy of each variable node of the LDPC codeword is computed. The energy of a variable node of the LDPC codeword can be determined as the number of unsatisfied check nodes that are connected to the variable node. At block 706, each variable node having an energy greater than a threshold energy can be added to a collection of candidate bits for bit flipping. The energy threshold can be set to, for example, half the degree of the variable node, or half of the number of check nodes that the variable node is connected to. The collection of candidate bits may include a set of candidate bits read as logic zero, and a set of candidate bits read as logic one.

At block 708, the asymmetric ratio is applied to flip bits in the collection of candidate bits to decode the LDPC codeword. For example, when the set of candidate bits read as logic zero has fewer number of candidate bits than multiplying the asymmetric ratio to a number of candidate bits in the set of candidate bits read as logic one, the asymmetric ratio can be applied by flipping all bits in the set of candidate bits read as logic zero, and randomly flipping the asymmetric ratio number of bits in the set of candidate bits read as logic one. When the set of candidate bits read as logic zero has equal or greater number of candidate bits than multiplying the asymmetric ratio to a number of candidate bits in the set of candidate bits read as logic one, the asymmetric ratio can be applied by flipping all bits in the set of candidate bits read as logic one, and randomly flipping the asymmetric ratio number of bits in the set of candidate bits read as logic zero. In some implementations, if the checksum does not converge, another decoding attempt can be performed if the asymmetric ratio is greater than a threshold value or less than a reciprocal of the threshold value.

Figure 8:
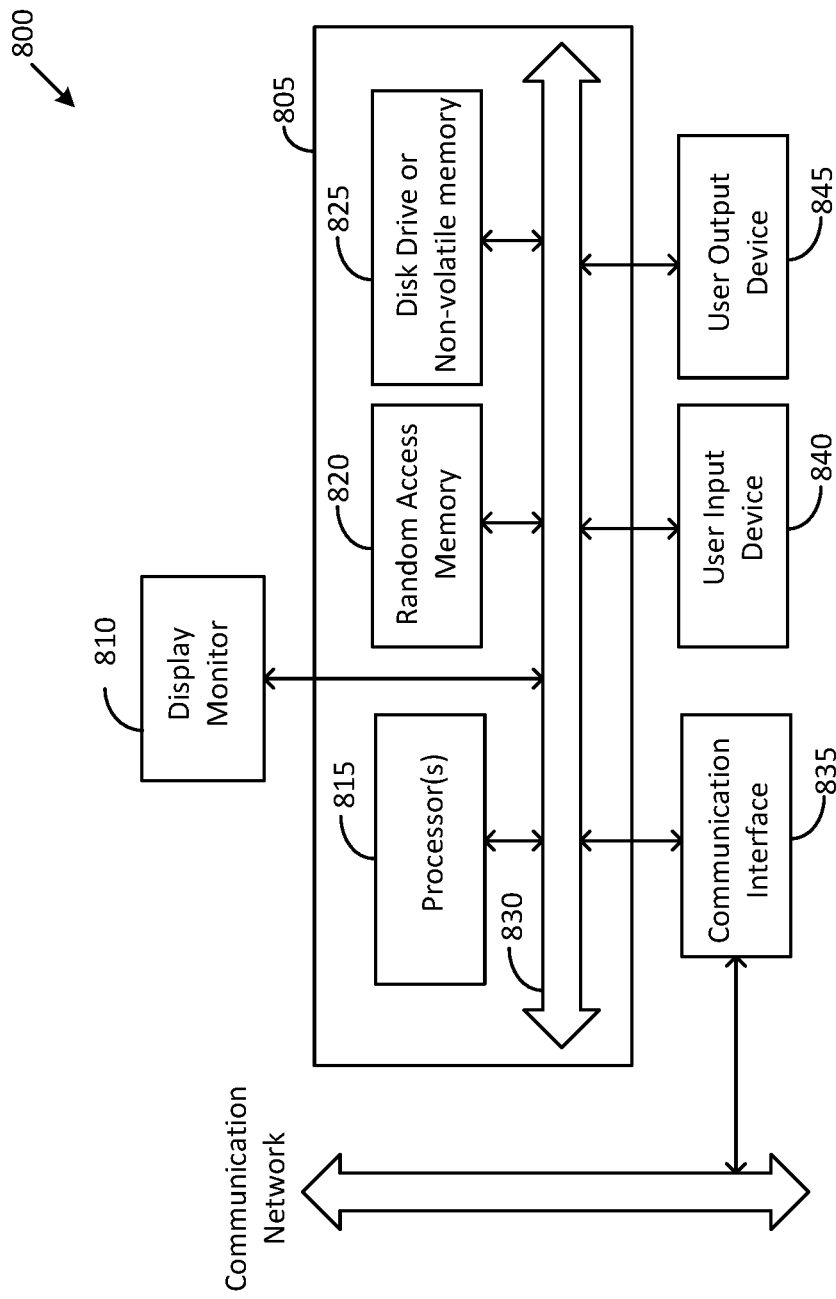
FIG. 8 illustrates an example computing device in accordance with an embodiment of the disclosure.

FIG. 8 illustrates a computer system 800 usable for implementing one or more embodiments of the present disclosure. FIG. 8 is merely an example and does not limit the scope of the disclosure as recited in the claims. As shown in FIG. 8, the computer system 800 may include a display monitor 810, a computer 805, a user output device 845, a user input device 840, a communications interface 838, and may further include other computer hardware or accessories. In an example implementation, the computer system 800, or select components of the computer system 800, can apply the asymmetric ratio estimation techniques disclosed herein. For example, non-volatile memory 825 may include a flash memory. Data read from the flash memory can be subject to the error correction, and the error correction can apply the asymmetric ratio in accordance with the techniques disclosed herein.

The computer 805 may include one or more processors such as, for example, the processor 815 that is configured to communicate with a number of peripheral devices via a bus subsystem 830. Some example peripheral devices may include the user output device 845, the user input device 840, and the communications interface 838. The computer 805 may further include a storage subsystem that includes a random-access memory (RAM) 820 and a disk drive 825 or other forms of non-volatile memory.

The user input device 840 can be any of various types of devices and mechanisms for inputting information to the computer 805 such as, for example, a keyboard, a keypad, a touch screen incorporated into the display, and audio input devices (such as voice recognition systems, microphones, and other types of audio input devices). In various embodiments, the user input device 840 is typically embodied as a computer mouse, a trackball, a track pad, a joystick, a wireless remote, a drawing tablet, a voice command system, an eye tracking system, and the like. The user input device 840 typically allows a user to select objects, icons, text and the like that appear on the monitor 810 via a command such as a click of a button or the like.

The user output device 845 can be any of various types of devices and mechanisms for outputting information from the computer 805 such as, for example, a display (e.g., the display monitor 810), non-visual displays such as audio output devices, etc.

The communications interface 838 provides an interface to a communication network. The communications interface 838 may serve as an interface for receiving data from and transmitting data to other systems. Embodiments of the communications interface 838 typically include an Ethernet card, a modem (telephone, satellite, cable, ISDN), (asynchronous) digital subscriber line (DSL) unit, FireWire interface, USB interface, and the like. In an example implementation, the communications interface 838 may be coupled to a computer network, to a FireWire bus, or the like. In other example implementations, the communications interfaces 838 may be physically integrated on the motherboard of the computer 805, and may include a software program, such as soft DSL, or the like.

In various embodiments, the computer system 800 may also include software that enables communications over a network such as the HTTP, TCP/IP, RTP/RTSP protocols, and the like. In alternative embodiments of the present disclosure, other communications software and transfer protocols may also be used, for example IPX, UDP or the like.

The RAM 820 and the disk drive 825 are examples of non-transitory computer-readable media configured to store computer-executable instructions for performing operations associated with various embodiments of the present disclosure, including executable computer code, human readable code, or the like. Other types of computer-readable storage media include floppy disks, removable hard disks, optical storage media such as CD-ROMs, DVDs and bar codes, semiconductor memories such as flash memories, non-transitory read-only-memories (ROMS), battery-backed volatile memories, networked storage devices, and the like. The RAM 820 and the disk drive 825 may be configured to store the basic programming and data constructs that provide the functionality of the present disclosure.

Software code modules and instructions that provide the functionality of the present disclosure may be stored in the RAM 820 and the disk drive 825. These software modules may be executed by the processor 815. The RAM 820 and the disk drive 825 may also provide a repository for storing data used in accordance with the present disclosure.

The RAM 820 and the disk drive 825 may include a number of memories such as a main random-access memory (RAM) for storage of instructions and data during program execution and a read-only memory (ROM) in which fixed non-transitory instructions are stored. The RAM 820 and the disk drive 825 may include a file storage subsystem providing persistent (non-volatile) storage for program and data files. The RAM 820 and the disk drive 825 may also include removable storage systems, such as removable flash memory.

The bus subsystem 830 provides a mechanism for letting the various components and subsystems of the computer 805 communicate with each other as intended. Although the bus subsystem 830 is shown schematically as a single bus, alternative embodiments of the bus subsystem may utilize multiple busses.

It will be readily apparent to one of ordinary skill in the art that many other hardware and software configurations are suitable for use with the present disclosure. For example, the computer 805 may be a desktop, portable, rack-mounted, or tablet configuration. Additionally, the computer 805 may be a series of networked computers. In still other embodiments, the techniques described above may be implemented upon a chip or an auxiliary processing board.

Various embodiments of the present disclosure can be implemented in the form of logic in software or hardware or a combination of both. The logic may be stored in a computer-readable or machine-readable non-transitory storage medium as a set of instructions adapted to direct a processor of a computer system to perform a set of steps disclosed in embodiments of the present disclosure. The logic may form part of a computer program product adapted to direct an information-processing device to perform a set of steps disclosed in embodiments of the present disclosure. Based on the disclosure and teachings provided herein, a person of ordinary skill in the art will appreciate other ways and/or methods to implement the present disclosure.

The data structures and code described herein may be partially or fully stored on a computer-readable storage medium and/or a hardware module and/or hardware apparatus. A computer-readable storage medium includes, but is not limited to, volatile memory, non-volatile memory, and magnetic and optical storage devices, such as disk drives, magnetic tape, CDs, DVDs, or other media, now known or later developed, that are capable of storing code and/or data. Hardware modules or apparatuses described herein include, but are not limited to, ASICs, FPGAs, dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

The embodiments disclosed herein are not to be limited in scope by the specific embodiments described herein. Various modifications of the embodiments of the present disclosure, in addition to those described herein, will be apparent to those of ordinary skill in the art from the foregoing description and accompanying drawings. Further, although some of the embodiments of the present disclosure have been described in the context of a particular implementation in a particular environment for a particular purpose, those of ordinary skill in the art will recognize that the disclosure's usefulness is not limited thereto and that the embodiments of the present disclosure can be beneficially implemented in any number of environments for any number of purposes.

What is claimed is:

1. A method for decoding a low-density parity check (LDPC) codeword by a bit flipping (BF) decoder, the method comprising:
   receiving a signal comprising bit data representing the LDPC codeword from a memory channel; and
   during an iteration of decoding in a decoding attempt:
      determining an asymmetric ratio of bit errors read as logic zero to bit errors read as logic one;
      computing an energy of each variable node of the LDPC codeword;
      for each variable node having an energy greater than a threshold energy, adding the variable node to a collection of candidate bits for bit flipping; and
      applying the asymmetric ratio to flip bits in the collection of candidate bits to decode the LDPC codeword.

2. The method of claim 1, wherein the collection of candidate bits includes a set of candidate bits read as logic zero, and a set of candidate bits read as logic one.

3. The method of claim 2, wherein when the set of candidate bits read as logic zero has fewer number of candidate bits than multiplying the asymmetric ratio to a number of candidate bits in the set of candidate bits read as logic one, the asymmetric ratio is applied by:
   flipping all bits in the set of candidate bits read as logic zero; and
   randomly flipping the asymmetric ratio number of bits in the set of candidate bits read as logic one.

4. The method of claim 2, wherein when the set of candidate bits read as logic zero has equal or greater number of candidate bits than multiplying the asymmetric ratio to a number of candidate bits in the set of candidate bits read as logic one, the asymmetric ratio is applied by:
   flipping all bits in the set of candidate bits read as logic one; and
   randomly flipping the asymmetric ratio number of bits in the set of candidate bits read as logic zero.

5. The method of claim 1, wherein the iteration of decoding is performed after a threshold number of previous decoding iterations have been performed without applying the asymmetric ratio.

6. The method of claim 5, further comprising:
   for each of the previous decoding iterations:
      storing a checksum of the previous decoding iteration;
      storing a number of variable nodes read as logic zero and having a hard decision of being logic one; and storing a number of variable nodes read as logic one and having a hard decision of being logic zero.

7. The method of claim 6, wherein the asymmetric ratio is determined based on the checksum, the number of variable nodes read as logic zero and having a hard decision of being logic one, and the number of variable nodes read as logic one and having a hard decision of being logic zero.

8. The method of claim 7, wherein the asymmetric ratio is determined when the number of 1's in the checksum of an iteration is less than half the number of 1's in an initial checksum.

9. The method of claim 8, wherein the asymmetric ratio is determined as:

$$\hat{\alpha}_r = \frac{C_i^{1 \to 0} * (n - n_1)}{C_i^{0 \to 1} * n_1}$$

in which $\hat{\alpha}_r$ is the asymmetric ratio, $C_i^{1 \to 0}$ is the number of variable nodes read as logic one and having a hard decision of being logic zero, $C_i^{0 \to 1}$ is the number of variable nodes read as logic zero and having a hard decision of being logic one, n is the total number of bits read, $n_1$ is the total number of bits read as logic one.

10. The method of claim 7, wherein the asymmetric ratio is determined by a neural network model trained on the checksum, the number of variable nodes read as logic zero and having a hard decision of being logic one, and the number of variable nodes read as logic one and having a hard decision of being logic zero.

11. The method of claim 1, further comprising performing another decoding attempt when the asymmetric ratio is greater than a threshold value or less than a reciprocal of the threshold value.

12. A device comprising:
a memory storing a low-density parity-check (LDPC) codeword; and
one or more processing units configured to:
receive a signal comprising bit data representing the LDPC codeword from a memory channel; and
perform operations during an iteration of decoding in a decoding attempt, the operations including:
determining an asymmetric ratio of bit errors read as logic zero to bit errors read as logic one;
computing an energy of each variable node of the LDPC codeword;
for each variable node having an energy greater than a threshold energy, adding the variable node to a collection of candidate bits for bit flipping; and
applying the asymmetric ratio to flip bits in the collection of candidate bits to decode the LDPC codeword.

13. The device of claim 12, wherein the collection of candidate bits includes a set of candidate bits read as logic zero, and a set of candidate bits read as logic one.

14. The device of claim 13, wherein when the set of candidate bits read as logic zero has fewer number of candidate bits than multiplying the asymmetric ratio to a number of candidate bits in the set of candidate bits read as logic one, the asymmetric ratio is applied by:
flipping all bits in the set of candidate bits read as logic zero; and
randomly flipping the asymmetric ratio number of bits in the set of candidate bits read as logic one.

15. The device of claim 13, wherein when the set of candidate bits read as logic zero has equal or greater number of candidate bits than multiplying the asymmetric ratio to a number of candidate bits in the set of candidate bits read as logic one, the asymmetric ratio is applied by:
flipping all bits in the set of candidate bits read as logic one; and
randomly flipping the asymmetric ratio number of bits in the set of candidate bits read as logic zero.

16. The device of claim 12, wherein the iteration of decoding is performed after a threshold number of previous decoding iterations have been performed without applying the asymmetric ratio.

17. The device of claim 12, wherein the asymmetric ratio is determined when the number of 1's in a checksum of the iteration is less than half the number of 1's in an initial checksum, and wherein the asymmetric ratio is determined based on the checksum of the iteration, a number of variable nodes read as logic zero and having a hard decision of being logic one, and a number of variable nodes read as logic one and having a hard decision of being logic zero.

18. The device of claim 17 wherein the asymmetric ratio is determined as:

$$\hat{\alpha}_r = \frac{C_i^{1 \to 0} * (n - n_1)}{C_i^{0 \to 1} * n_1}$$

in which $\hat{\alpha}_r$ is the asymmetric ratio, $C_i^{1 \to 0}$ is the number of variable nodes read as logic one and having a hard decision of being logic zero, $C_i^{0 \to 1}$ is the number of variable nodes read as logic zero and having a hard decision of being logic one, n is the total number of bits read, $n_1$ is the total number of bits read as logic one.

19. The device of claim 17, wherein the asymmetric ratio is determined by a neural network model trained on the checksum, the number of variable nodes read as logic zero and having a hard decision of being logic one, and the number of variable nodes read as logic one and having a hard decision of being logic zero.

20. The device of claim 12, wherein the operations include performing another decoding attempt when the asymmetric ratio is greater than a than a threshold value or less than a reciprocal of the threshold value.

* * * * *